(12) United States Patent
Ishii et al.

(10) Patent No.: US 6,677,620 B2
(45) Date of Patent: Jan. 13, 2004

(54) ORGANIC EL ELEMENT AND METHOD OF MANUFACTURING THE SAME

(75) Inventors: Ikuko Ishii, Tokyo (JP); Yuji Kondo, Tokyo (JP)

(73) Assignee: NEC Corporation, Tokyo (JP)

( * ) Notice: Subject to any disclaimer, the term of this patent is extended or adjusted under 35 U.S.C. 154(b) by 19 days.

(21) Appl. No.: 09/864,263

(22) Filed: May 25, 2001

(65) Prior Publication Data

US 2002/0000560 A1 Jan. 3, 2002

(30) Foreign Application Priority Data

May 31, 2000 (JP) .......................... 2000-161887

(51) Int. Cl.7 .............................. H01J 2/62; H01L 33/00
(52) U.S. Cl. .................. 257/100; 313/489; 313/492; 313/493; 313/505; 313/512
(58) Field of Search ................... 313/489, 491, 313/492, 493, 500, 505, 512; 257/98, 99, 100

(56) References Cited

U.S. PATENT DOCUMENTS 6,339,288 B1 * 1/2002 Qian et al. ................. 313/498

FOREIGN PATENT DOCUMENTS

| JP | H11-329717 | 11/1999 |
|---|---|---|
| JP | H12-3782 | 1/2000 |
| KR | 1999-0045574 | 6/1999 |

* cited by examiner

Primary Examiner—Minh Loan Tran
Assistant Examiner—Tan Tran
(74) Attorney, Agent, or Firm—Sughrue Mion, PLLC

(57) ABSTRACT

An organic EL element includes a light-transmitting glass substrate, an organic electroluminescence (EL) layer, a frame, a sealing cap, and an adhesive. The organic EL layer is formed on an element formation region of the substrate. The frame is formed on the substrate to surround the element formation region. The frame has a flat upper surface that has absorbed a three-dimensional shape on a surface of the substrate. The sealing cap is to be fixed to an upper surface of the frame. The adhesive adheres the frame and the sealing cap to each other. The adhesive is set at a temperature lower than a heat resistant temperature of the organic EL layer. A method of manufacturing the organic EL element is also disclosed.

18 Claims, 3 Drawing Sheets

ORGANIC EL ELEMENT AND METHOD OF MANUFACTURING THE SAME

BACKGROUND OF THE INVENTION

The present invention relates to an organic EL (ElectroLuminescence) element and, more particularly, to an organic EL element in which an organic EL layer is hermetically sealed with a hermetic sealing cap, and a method of manufacturing the same.

EL is a phenomenon in that a certain type of phosphor emits light upon application of an electric field, and an element that utilizes this phenomenon is an EL element. In the structure of an organic EL element, an organic layer made of a light-emitting material using an organic compound is sandwiched between two electrodes. The arrangement of the organic layer includes a multilayered structure of a light-emitting layer made of a fluorescent organic solid such as anthracene and a hole injection layer made of a triphenylamine derivative or the like. Another organic layer is also available which is comprised of a multilayered structure of a light-emitting layer and an electron injection layer made of a perylene derivative, or a multilayered structure of a hole injection layer (hole transport layer), an EL light-emitting layer, and an electron injection layer (electron transport layer). In the organic EL element, a multilayered structure interposed between two electrodes is generally formed on a substrate.

Such an organic EL element utilizes light emitted when electrons injected to the light-emitting layer are recombined with holes. With this organic EL element, high-luminance light emission of several 100 $cd/m^2$ to several ten 1,000 $cd/m^2$ can be obtained with a voltage of about 10 V, and the response speed is also high.

The organic EL element has a disadvantage in that it is not resistant to water. For example, even a very small amount of water can separate the light-emitting layer and electrode layer from each other, or denature the materials constituting the light-emitting layer and the like. In this case, a non-emission portion called a dark sport is formed to degrade the quality of emission. Therefore, when a conventional organic EL element is driven in the atmosphere, its light-emitting characteristics quickly degrade. In order to obtain a practical organic EL element, the element must be sealed so water or the like will not enter the light-emitting layer.

As a structure for sealing the organic EL element, a structure in which a resin or the like is directly applied to the organic EL element, or a hollow structure filled with a gas or liquid is available. FIG. 3 shows the arrangement of an organic EL element to which a conventional sealing structure (filled-type structure) is applied. In the organic EL element shown in FIG. 3, anodes 13, an organic EL layer 14, and cathodes 15 are sequentially formed on a glass substrate 12. For example, the organic EL layer 14 has a multilayered structure of a hole transport layer and an EL light-emitting layer. In a filled-type structure, the organic EL element formed on the glass substrate 12 is covered with a hermetic sealing cap 16 fixed by an adhesive 41, and the interior of the hermetic sealing cap 16 is filled with an inert gas.

As the material of the sealing cap 16, for example, a glass, metal, or plastic is used. As the adhesive 41 for bonding the glass substrate 12 and sealing cap 16 with each other, a resin that sets at room temperature or a resin that sets upon irradiation with ultraviolet rays is used because the organic EL element has a low heat resistance. When the sealing cap 16 is to be fixed on the glass substrate 12 by using such an adhesive, after the adhesive 41 is applied to the bonding surface of the glass substrate 12 or sealing cap 16, operation of fixing the glass substrate 12 and sealing cap 16 is necessary.

When the organic EL element as described above is to be downsized, the area of a region that does not contribute to light emission must be reduced. A region that does not contribute to light emission includes a portion necessary for sealing adhesion, a region between a sealing adhesion portion and the end of a light-emitting region, an electrode (anode) extraction portion, and the like. An electrode with a thickness of about 100 nm, which is necessary for causing the internal organic EL element to emit light, is formed on the surface of the glass substrate 12. The glass substrate 12 itself has a warp or undulation of at least about several $\mu$m.

Hence, the warp or undulation described above and a three-dimensional shape (step) formed by the electrode are present on that portion of the glass substrate 12 which is to be bonded to the sealing cap 16. When the glass substrate 12 and sealing cap 16 are brought into direct contact with each other, they do not come into tight contact with each other but leave many gaps between them. For this reason, the adhesive 41 is applied to a certain constant thickness (10 $\mu$m to several 100 $\mu$m) to absorb the three-dimensional shape, and the glass substrate 12 and sealing cap 16 are bonded to each other to form no gaps between them. Since the adhesive 41 is applied thick in this manner, when the glass substrate 12 and sealing cap 16 are aligned with and pressed against each other, the sandwiched adhesive 41 may be squeezed and extend to likely attach to the organic EL element.

When the adhesive 41 attaches to the organic EL element, a stress is generated to act on the organic EL element regardless of whether the adhesive 41 is set/unset. The organic EL element which is very thin is thus damaged to form a non-emission portion. For this reason, squeezing of the adhesive 41 must be controlled. When the amount of adhesive 41 is reduced, although squeezing does not occur, the three-dimensional shape cannot be sufficiently absorbed by the adhesive 41, and adhesion becomes poor to form gaps, so hermeticity cannot be held.

The adhesive 41 used for sealing the organic EL element must be set at a temperature which is low to such a degree that it does not degrade the organic EL element. Also, a gas that adversely affects the organic EL element during setting should not be generated. In addition, the adhesive 41 must have a low permeability so that hermeticity can be held over a long period of time.

From the above requirements, the adhesive used for sealing the organic EL element must have the following characteristics:

1. A warp or undulation on the bonding surface between the sealing cap and glass substrate, and a step formed by an extraction interconnection can be planarized sufficiently.
2. The setting temperature (adhesive fixing temperature) is lower than a temperature that the organic EL element can stand.
3. No gas toxic to the organic EL element is generated during setting.
4. The set adhesive has a low permeability.
5. The interface of the adhesive has low adhesion properties and water permeation from the interface with the hermetic sealing cap or glass substrate is sufficiently small.

Although an ultraviolet-curing epoxy resin which does not require heating can satisfy the required characteristics of items 1 to 3, and 5, its permeability is not very low, which is disadvantageous in holding the hermeticity. In contrast to this, although a thermosetting epoxy resin has a lower permeability than that of the ultraviolet-curing epoxy resin, the gas generated during setting degrades the organic EL element, and the temperature necessary for setting exceeds the heat resistance of the organic EL element. Therefore, this epoxy resin does not satisfy the items 2 and 3, and cannot be adopted for sealing the organic EL element.

Therefore, conventionally, the ultraviolet-curing resin is used, although its hermeticity holding level is insufficient from the viewpoint of the service life of the organic EL element. Also, the thickness of the adhesive is decreased as much as possible in order to compensate for the low permeability. When the material of the sealing cap is a conductive metal, partly because of the molding precision of the sealing cap, the thickness of the adhesive cannot be made thin when preventing the organic EL element and the connecting electrode from coming into contact with each other. In this case, water penetration from the thick adhesive layer to the interior where the organic EL element is formed cannot be suppressed very much, and the service life of the organic EL element is shortened.

SUMMARY OF THE INVENTION

It is an object of the present invention to provide an organic EL element with a longer service life, and a method of manufacturing the same.

In order to achieve the above object, according to the present invention, there is provided an organic EL element comprising a light-transmitting transparent substrate, an organic electroluminescence (EL) layer formed on an element formation region of the substrate, a frame formed on the substrate to surround the element formation region, the frame having a flat upper surface that has absorbed a three-dimensional shape on a surface of the substrate, a sealing cap to be fixed to an upper surface of the frame, and an adhesive layer for adhering the frame and the sealing cap to each other, the adhesive layer being set at a temperature lower than a heat resistant temperature of the organic EL layer.

DESCRIPTION OF THE PREFERRED OF EMBODIMENT

The present invention will be described with reference to the accompanying drawings.

Figure 1A:
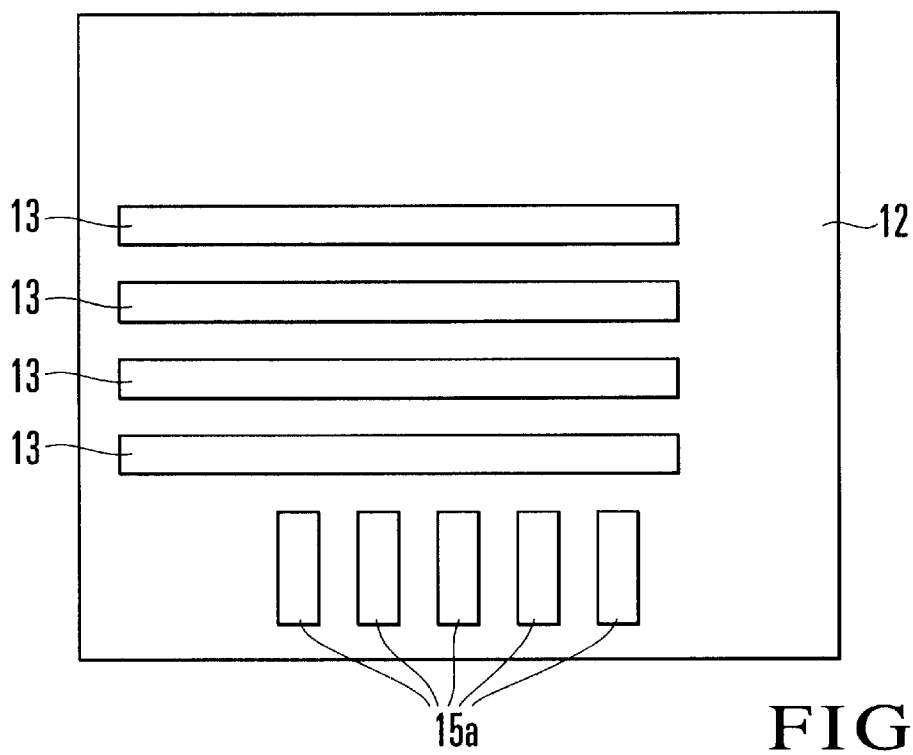
FIGS. 1A to 1D are plan views showing the steps in manufacturing an organic EL element according to an embodiment of the present invention.

FIGS. 1A to 1D show the steps in manufacturing an organic EL element according to an embodiment of the present invention. As shown in FIG. 1A, anodes 13 comprising ITO (Indium Tin Oxide) films formed by sputtering or the like to have a thickness of 100 nm to 200 nm, and cathode extraction interconnections 15a are formed on a glass substrate 12 formed of a soda-lime glass plate with a thickness of approximately 0.7 mm to 1.1 mm. The ITO films, e.g., the anodes 13, which are used as transparent conductive films used for electrodes to be formed on the surface of the glass substrate 12 perform display by transmitting light generated in the organic EL layer, and accordingly preferably has a high light transmittance.

Figure 1B:
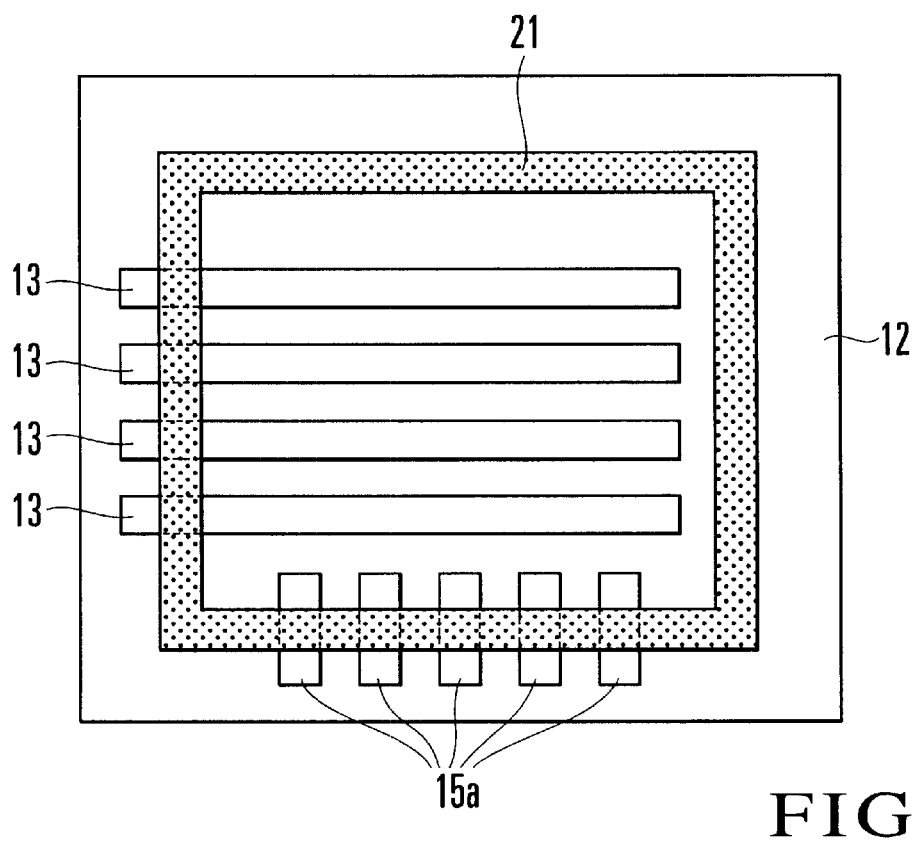

As shown in FIG. 1B, a frame 21 made of a thin film is formed on the glass substrate 12 where the anodes 13 and cathode extraction interconnections 15a are formed. The frame 21 is formed as a square frame outside the light-emitting portion to surround it, and absorbs steps formed by the extraction portions of the anodes 13 and the cathode extraction interconnections 15a. Hence, the upper surface of the frame 21 becomes flat. The formation range of the frame 21 almost corresponds to the adhesion surface of the hermetic sealing cap 16. As the material of the frame 21, a synthetic resin which can form a uniform layer and has a low permeability after setting is used, e.g., a two-pack type epoxy resin (manufactured by NTT ADVANCED TECHNOLOGY CORPORATION: tradename 14SI). The material used to form the frame 21 preferably has a permeability of approximately 1.33 (ml·cm)/(cm$^2$·s·Pa) or less.

Formation of the frame 21 will be described in more detail. First, a resist pattern made of the above material (two-pack type epoxy resin) is formed at a predetermined region of the glass substrate 12 by screen printing. The glass substrate 12 formed with the resist pattern is heated to a high temperature of about 150° C., so the resist pattern is set, thereby forming the frame 21. After the frame 21 is formed, it is heated to a temperature of its glass transition point or less in a vacuum oven in order to completely remove a gas produced by the frame 21. The frame 21 is formed to a thickness of approximately 10 $\mu$m to fill recesses formed by, e.g., the anodes 13. The upper surface of the frame 21 is formed almost flat by, e.g., the surface tension of the material during formation of the resist pattern. The thickness of the frame 21 may fall within a range of several $\mu$m to several 100 $\mu$m.

Figure 1C:
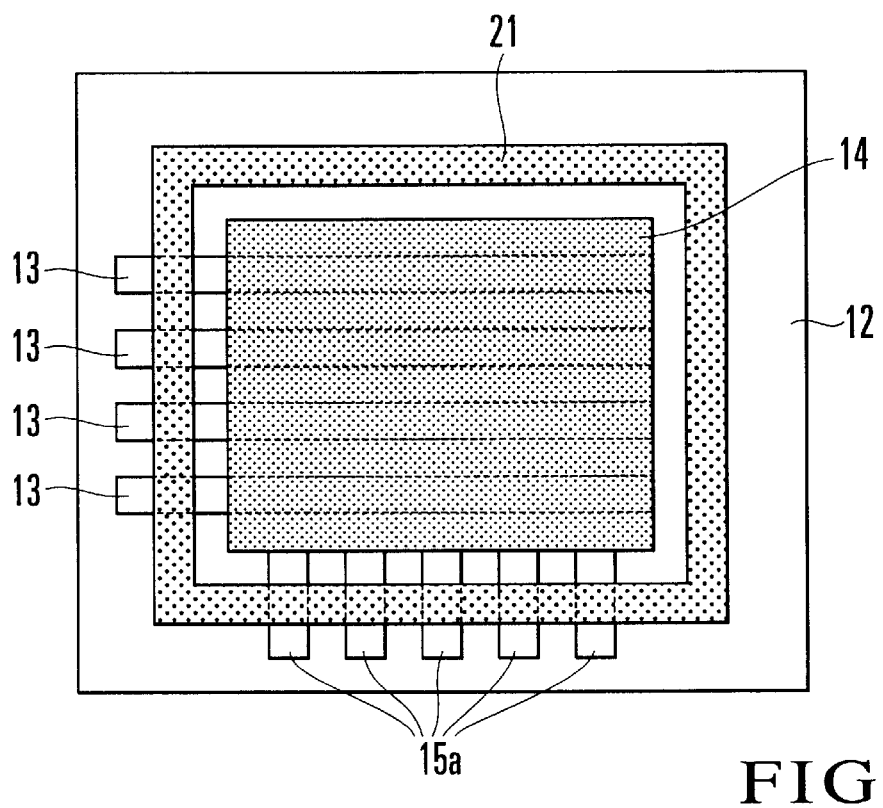

As shown in FIG. 1C, a hole transport layer and EL light-emitting layer are sequentially formed at a predetermined region of the glass substrate 12 formed with the anodes 13, to form an organic EL layer 14. More specifically, the hole transport layer is formed by vacuum vapor deposition of N, N'-diphenyl-N, N'-bis($\alpha$-naphthyl)-1, 1'-biphenyl-4, 4'-diamine (to be abbreviated as $\alpha$-NPD hereinafter) as the material. In this vacuum vapor deposition, first, the glass substrate 12 is fixed on a substrate holder in a vacuum vapor deposition unit (not shown) such that the anodes 13 are located on the lower side, and a metal shadow mask with an opening corresponding to a range where the hole transport layer is to be formed by vapor deposition is arranged at a predetermined portion on the anode side of the glass substrate 12.

The $\alpha$-NPD is accommodated as a hole injection/hole transport material in a resistance heater boat, and the interior of the vacuum vapor deposition unit is evacuated by a vacuum pump to approximately 1×10E−4 Pa or less. After that, a current is supplied to the resistance heater boat accommodating the $\alpha$-NPD to heat it at about 300° C. to 400° C. Thus, an $\alpha$-NPD film is deposited at the predetermined region of the glass substrate 12 to a thickness of about 50 nm, thus forming the hole transport layer.

The EL light-emitting layer is formed by vacuum vapor deposition of a tris(8-quinolinolate)aluminum complex (to be abbreviated as Alq3 hereinafter) as the material. In this vacuum vapor deposition, first, the glass substrate 12 is fixed on the substrate holder in the vacuum vapor deposition unit such that the hole transport layer formation surface is located on the lower side, and a metal shadow mask with an opening corresponding to a region where the EL light-emitting layer is to be formed by vapor deposition is arranged at a predetermined portion on the hole transport layer formation surface side of the substrate. Alq3 is accommodated in the resistance heater boat as the light-emitting material, and the interior of the vacuum vapor deposition unit is evacuated by the vacuum pump to approximately 1×10E−4 Pa or less. After that, a current is supplied to the resistance heater boat accommodating Alq3 to heat it at about 300° C. to 400° C. Thus, an Alq3 film is deposited to a thickness of 50 nm, thereby forming the organic EL layer 14. The organic EL layer 14 formed in this manner constitutes a green-emitting layer.

Figure 1D:
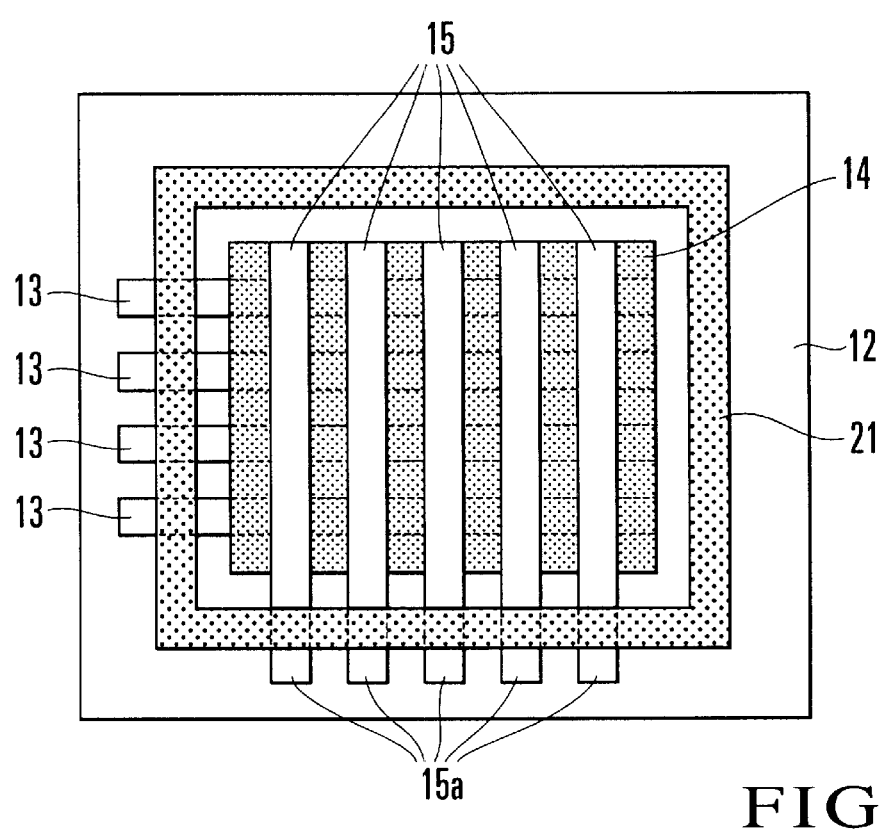

After that, as shown in FIG. 1D, cathodes 15 made of, e.g., a magnesium-silver alloy, are formed on the organic EL layer 14. One end of each cathode is connected to the corresponding cathode extraction interconnection 15a which has already been formed. To form the cathodes 15, alloy layers may be selectively formed to a thickness of approximately 200 nm by vacuum vapor deposition using magnesium and silver as the vapor deposition source. When the cathodes 15 opposing the anodes 13 are formed, the light-emitting layer of the organic EL layer 14 is formed in a frame defined by the frame 21 of the glass substrate 12.

In this embodiment, the cathode extraction interconnections 15a to be electrically connected to the cathodes 15 are formed of the ITO films. However, the present invention is not limited to this, and the cathode extraction interconnections 15a may be formed of the same metal material as that of the cathodes 15. In the light-emitting layer formed of the organic EL layer 14, pixels formed of the interconnections of the anodes and cathodes have a size of 0.3 mm×0.3 mm each when seen from above, and these pixels are arranged to form a matrix of 4×5.

Figure 2A:
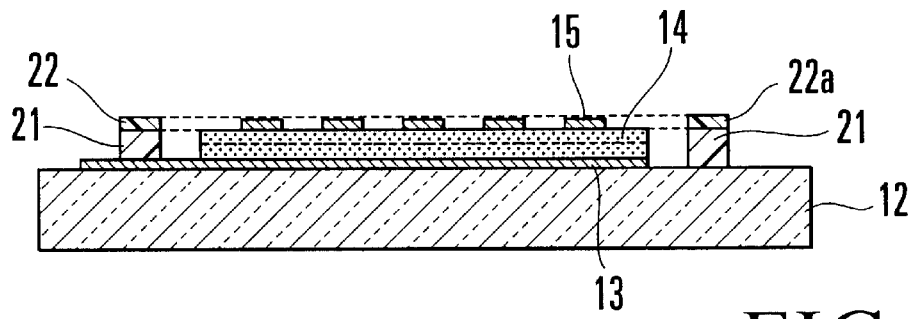
FIGS. 2A and 2B are sectional views showing the steps, following FIG. 1D, in manufacturing the organic EL element.

As shown in FIG. 2A, an adhesive 22a is applied to the upper surface of the frame 21. The adhesive 22a can be applied by a general application method, e.g., a dispensing method or screen printing method. As the adhesive 22a, for example, an ultraviolet-curing epoxy resin may be used. The ultraviolet-curing epoxy resin does not produce a gas that adversely affects the light-emitting layer during curing, and a temperature necessary for the ultraviolet-curing epoxy resin to set is lower than the resistance temperature of an organic EL film which forms the light-emitting layer. Alternatively, as the adhesive 22a, a two-pack epoxy resin may be used, in which a curing initiating agent is added to the matrix immediately before adhesion to allow curing.

The upper surface of the frame 21 to which the adhesive 22a is to be applied is flat as it has absorbed the three-dimensional shapes or the like formed by the anodes 13 on the surface of the glass substrate 12. Hence, the adhesive 22a need not absorb the three-dimensional shapes. For this reason, the thickness of the layer of the adhesive 22a need not be very large, and suffices if is approximately 7 $\mu$m to 10 $\mu$m. The material of the adhesive 22a may alternatively be a room temperature curing-type epoxy resin or a thermosetting epoxy resin which can be set at 85° C. or less. Note that the material of the adhesive 22a should not produce a gas that adversely affects the light-emitting layer during setting. The adhesive 22a may be applied to only the adhesion surface of the sealing cap 16 (to be described later), or to both the frame 21 and the adhesion surface of the hermetic sealing cap 16.

Figure 2B:
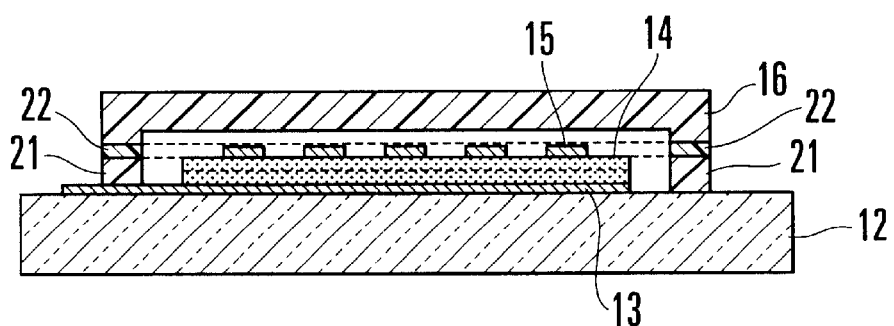
Figure 3:
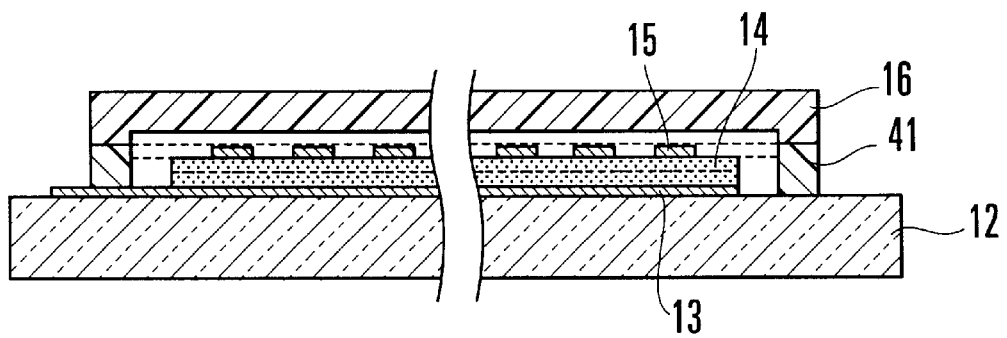
FIG. 3 is a sectional view of an organic EL element with a conventional sealing structure.

After the adhesive 22a to serve as a sealing adhesion layer 22 is applied, in a sealing container filled with nitrogen gas from which water is removed to provide a dew point of as low as −72° C., a sealing cap 16 is brought into contact with the upper surface of the frame 21 through the adhesive 22a. While a pressure is applied between the glass substrate 12 and sealing cap 16, the adhesive 22a is irradiated with ultraviolet rays and is accordingly cured. At this time, the pressure to be applied between the sealing cap 16 and glass substrate 12 is controlled so that the thickness after curing of the layer formed of the adhesive 22a becomes several $\mu$m or less. As a result, as shown in FIG. 2B, the sealing cap 16 is adhered to the frame 21, so the organic EL layer 14 is hermetically sealed in the dry nitrogen gas with the sealing cap 16.

Conventionally, the glass substrate and the sealing cap are adhered to each other without using a frame 21. Therefore, when the sealing cap is to be bonded to the glass substrate, the layer of the fluidized adhesive is squeezed to spread. If the adhesive which is squeezed and spreads over the glass substrate comes into contact with the organic EL layer, inconveniences such as formation of non-emission portions occur. If the squeezed adhesive spreads to the outside of the glass substrate, the extraction interconnections connected at the periphery of the glass substrate become narrow, causing inconveniences, e.g., interfering with connection of the interconnections.

The above inconveniences hinder downsizing of the organic EL element. However, as in this embodiment, if the frame 21 is provided, spreading of the adhesive 22a can be stopped by the rim of the frame 21. Since the amount of adhesive 22a can be decreased, when the sealing cap 16 is to be bonded to the glass substrate 12, the spreading amount of the adhesive 22a is decreased. Hence, when compared to the prior art, the unnecessary region between the adhesion region of the sealing cap 16 and the light-emitting layer can be further decreased, so the organic EL layer 14 can be downsized. The material of the sealing cap 16 is not limited to glass, but can be stainless steel, hard aluminum, plastic, or the like. As the plastic, one with a small permeability is preferable. A plastic material with a large permeability can also be employed if a barrier layer made of a metal is formed on the inner side of the sealing cap 16.

A DC low-current power supply was connected to the anodes and cathodes of the organic EL layer 14, sealed in this manner, through extraction electrodes, to supply a power under the atmospheric pressure at a temperature of 25° C. such that the initial luminance was 100 cd/m$^2$. At this time, the current was 0.015 mA and the voltage was 9 V. Successively, an enlarged picture (×30) of the emission surface was photographed. When the ratio of total area of the dark spots when seen from above to the area of the emission surface when seen from above (to be referred to as the ratio of the non-emission area to be described later) was calculated from this picture, it was 0.5%. When the diameter of a certain dark spot was measured, it was 7 $\mu$m.

The above organic EL layer 14 was stored for 500 hrs in an atmosphere at a temperature of 50° C. and at a relative humidity of 90% without supplying power to it. After that, when the non-emission area was calculated in the same manner as that described above, it was 0.7%. It was confirmed that the non-emission area did not substantially change from the initial value. When the diameter of the same dark spot as that described above was measured, it was 9 $\mu$m, which had not substantially changed from the initial diameter. This value is smaller than that of the prior art (to be described later). From the foregoing, in this embodiment, the growth of the dark spot was suppressed.

The values exhibiting the sealing performance of the organic EL layer 14 sealed in the conventional method are as follows. A result obtained by evaluating the organic EL layer 14 sealed by the conventional method in the same manner as in the evaluation method described above will be described. When the initial ratio of the non-emission area was calculated, it was 0.4%. When the diameter of a certain dark spot was measured, it was 6 $\mu$m. The above organic EL layer 14 was stored for 500 hrs in an atmosphere at a temperature of 50° C. and at a relative humidity of 90% without supplying a power to it. After that, when the non-emission area was calculated in the same manner as that described above, it was 4.6%. When the diameter of the same dark spot as that described above was measured, it had grown to 25 $\mu$m.

In the above embodiment, an organic material is used to form the frame. However, the material of the frame is not limited to this, but the frame may alternatively be made of a low-melting glass. For example, by using a paste obtained by dispersing low-melting glass fine particles in an organic binder, a paste pattern is formed by screen printing in the same manner as that described above. The paste pattern is then calcined at 400° C. to 500° C., so that a frame made of low-melting glass can be formed.

After the frame is formed, an organic EL layer is formed in the same manner as in FIGS. 1B to 1D and FIGS. 2A and 2B described above. After the organic EL layer is formed, a sealing cap is adhered to the frame with an adhesive made of an ultraviolet-curing epoxy resin, thus forming the hermetically sealed organic EL layer 14.

A result obtained by evaluating (non-driven storage for 500 hrs in an atmosphere at a temperature of 50° C. and a relative humidity of 90%) the organic EL layer 14, obtained in this manner and using the frame made of the low-melting glass, will be described later. The ratio of the non-emission area after evaluation was 0.8% when compared to 0.5% as its initial value. The diameter of the dark spot at this time after evaluation was 7 $\mu$m, when compared to 5 $\mu$m as its initial value. As a result, an effect was confirmed.

The frame may alternatively be formed by sputtering a non-conductive material, e.g., SiO or $SiO_2$. After a frame made of a non-conductive material is formed, an organic EL layer is formed in the same manner as in FIGS. 1B to 1D and FIGS. 2A and 2B described above. After the organic EL layer is formed, a sealing cap is adhered to the frame with an adhesive made of an ultraviolet-curing epoxy resin, thereby forming a hermetically sealed organic EL layer 14.

The organic EL layer 14 sealed in this manner was evaluated in the same manner as that described above (non-driven storage for 500 hrs in an atmosphere with a temperature of 50° C. and at a relative humidity of 90%). The ratio of the non-emission area after evaluation was 0.8%. At this time, the diameter of the dark spot was 8 $\mu$m, when compared to 5 $\mu$m as its initial value. As a result, an effect was confirmed.

As has been described above, according to the present invention, a frame is formed in advance on a transparent substrate such as a glass substrate, an organic EL layer is formed inside the frame, and after that a hermetic sealing cap is adhered to the frame. Therefore, an adhesive layer necessary for adhering the hermetic sealing cap can be made thin. This improves the hermeticity and prolongs the service life of the organic EL element.

What is claimed is:

1. An organic EL element comprising:
a light-transmitting transparent substrate;
an organic electroluminescence (EL) layer formed on an element formation region of said substrate;
a frame formed on said substrate to surround said element formation region, said frame having a flat upper surface that has absorbed a three-dimensional shape on a surface of said substrate;
a sealing cap to be fixed to said upper surface of said frame; and
an adhesive layer for adhering said frame and said sealing cap to each other, said adhesive layer being set at a temperature lower than a heat resistant temperature of said organic EL layer,
wherein said adhesive layer is between said flat upper surface of said frame and said sealing cap.

2. An element according to claim 1, wherein said frame is made of an organic material that is set at a temperature higher than the heat resistant temperature of said organic EL layer.

3. An element according to claim 2, wherein said frame is formed by thermally setting said organic material that is set at the temperature higher than the heat resistant temperature of said organic EL layer, and heating said organic material to a glass transition temperature thereof.

4. An element according to claim 1, wherein said frame is made of glass.

5. An element according to claim 1, wherein said frame is made of a silicon oxide.

6. An element according to claim 1, wherein said adhesive layer is made of an ultraviolet-curing epoxy resin.

7. An element according to claim 6, wherein after said frame and said sealing cap are adhered to each other, the epoxy resin is set upon irradiated with ultraviolet rays.

8. An element according to claim 1, wherein said organic EL layer is hermetically sealed in a container which is formed of said substrate, said frame, and said sealing cap and which is filled with an inert gas at not more than a predetermined humidity.

9. An element according to claim 8, wherein the inert gas is nitrogen gas.

10. An element according to claim 1, wherein said substrate is made of transparent glass.

11. An element according to claim 1, wherein said adhesive has a thickness of several $\mu$m or less.

12. An element according to claim 1, wherein said frame has a permeability of 1.33 (ml·cm)/($cm^2$·s·Pa) or less.

13. An element according to claim 1, wherein said frame has an inner side surface and an outer side surface which are approximately orthogonal to said substrate, and which do not contact said adhesive layer.

14. An element according to claim 1, wherein said flat upper surface is approximately parallel to said substrate.

15. An organic EL element comprising:
a light-transmitting transparent substrate;
an organic electroluminescence (EL) layer formed on an element formation region of said substrate;
a frame formed on said substrate to surround said element formation region, said frame having a flat upper surface that has absorbed a three-dimensional shape on a surface of said substrate;
a sealing cap to be fixed to said upper surface of said frame; and
an adhesive layer for adhering said frame and said sealing cap to each other, said adhesive layer being set at a temperature lower than a heat resistant temperature of said organic EL layer,
wherein said frame is made of an organic material that is set at a temperature higher than the heat resistant temperature of said organic EL layer.

16. An element according to claim 15, wherein said frame is formed by thermally setting said organic material that is set at the temperature higher than the heat resistant temperature of said organic EL layer, and heating said organic material to a glass transition temperature thereof.

17. An organic EL element comprising:

a light-transmitting transparent substrate;

an organic electroluminescence (EL) layer formed on an element formation region of said substrate;

a frame formed on said substrate to surround said element formation region, said frame having a flat upper surface that has absorbed a three-dimensional shape on a surface of said substrate;

a sealing cap to be fixed to said upper surface of said frame; and an adhesive layer for adhering said frame and said sealing cap to each other, said adhesive layer being set at a temperature lower than a heat resistant temperature of said organic EL layer, wherein said frame has a permeability of 1.33 (ml·cm)/(cm2·s·Pa) or less.

18. An organic EL element comprising:

a light-transmitting transparent substrate;

an organic electroluminescence (EL) layer formed on an element formation region of said substrate;

a frame formed on said substrate to surround said element formation region, said frame having a flat upper surface that has absorbed a three-dimensional shape on a surface of said substrate;

a sealing cap to be fixed to said upper surface of said frame; and an adhesive layer for adhering said frame and said sealing cap to each other, said adhesive layer being set at a temperature lower than a heat resistant temperature of said organic EL layer, wherein said frame has an inner side surface and an outer side surface which are approximately orthogonal to said substrate, and which do not contact said adhesive layer.

* * * * *